May 9, 1967 J. E. ALLEGRETTI ET AL 3,318,814
DOPED SEMICONDUCTOR PROCESS AND PRODUCTS PRODUCED THEREBY
Filed July 1, 1965
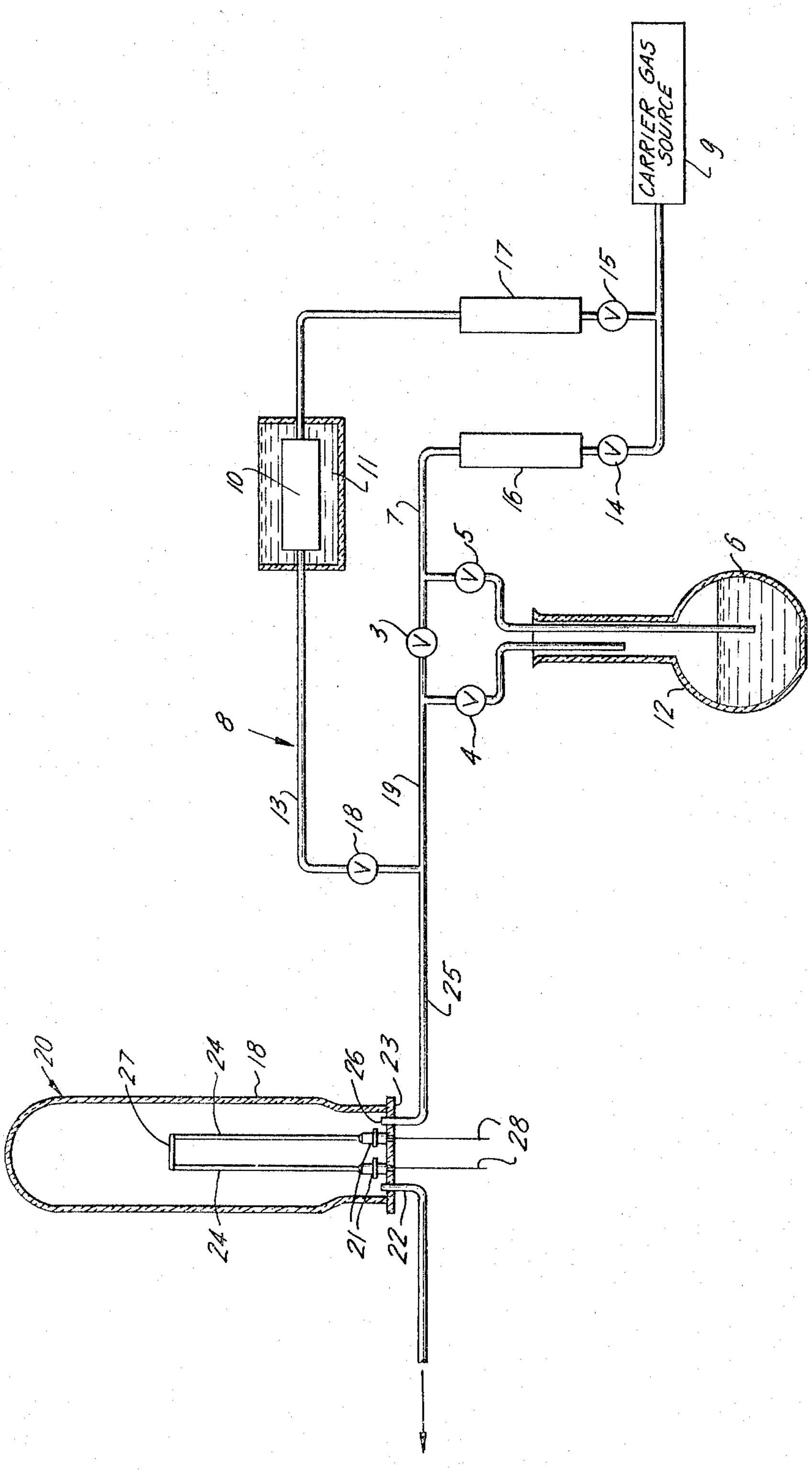

United States Patent Office 3,318,814
Patented May 9, 1967

3,318,814

DOPED SEMICONDUCTOR PROCESS AND PRODUCTS PRODUCED THEREBY

John E. Allegretti, East Brunswick, and Frederick O. Fisher, Middletown, N.J., assignors to Siemens-Schuckertwerke Aktiengesellschaft, Berlin, Germany, a corporation of Germany Filed July 1, 1965, Ser. No. 468,803
2 Claims. (Cl. 252—62.3)

This application is a continuation-in-part of application Ser. No. 213,083, filed July 24, 1962, now abandoned, which in turn is a continuation-in-part of application Ser. No. 105,672, filed Apr. 26, 1961, and relates to a method for doping semiconductor materials and, more particularly, it relates to a method for introducing controlled amounts of conductivity type imparting impurity atoms from a solid source into the crystal structure of a semiconductor body during the growth thereof.

It is well recognized in the prior art that semiconductor materials which are intrinsic or nearly instrinsic are undesirable for use in electronic circuit applications. The undesirable characteristics are manifested as a consequence of the nature of the crystal binding forces which exist in the bulk of the material. The electrons in electron-pairs shared between adjoining atoms in intrinsic semiconductor materials are very tightly bound to each other and require large amounts of energy to be disrupted and thereby give off an electron for conduction. This difficulty has led to the concept of incorporating small amounts of impurity atoms within the crystal lattice structure of the semiconductor material to enhance the conduction characteristics thereof. In order to be effective in this repsect, the impurity atoms must be capable of being ionized at reasonable energies, such as for example, at room temperature or under moderate illumination.

The major problem confronting the art with respect to introducing the impurity atoms into the semiconductor crystal has been one of control. In as much as very small quantities of impurity atoms are required in order to effect the desired change in the characteristics of the semiconductor material, it is apparent that sensitive means must be used to regulate the introduction of the impurity into the semiconductor body.

Accordingly, it is an object of the present invention to provide a method for introducing conductivity type imparting impurity atoms into the crystal structure of a semiconductor material.

It is another object of the present invention to provide a method for introducing easily controlled amounts of conductivity type imparting impurity atoms from a solid source thereof into the crystal lattice of a semiconductor material.

It is another object of the present invention to provide a method for producing a semiconductor body having uniformly distributed throughout its structure a quantity of conductivity type imparting impurity atoms.

Still another object of the present invention is to provide a method for producing a semiconductor body having a predetermined resistivity.

These and other objects of the present invention will become apparent when consideration is given to the following disclosure in conjunction with the accompanying drawing wherein an apparatus suitable for carrying out the method of the present invention is presented in schematic form.

In general, the method of the present invention contemplates the introduction of easily controlled amounts of conductivity type imparting atoms from a solid doping source into the structure of a semiconductor body during the growth thereof. This method includes the steps of saturating a carrier gas with a controlled amount of conductivity type imparting impurity atoms derived from a solid source of said atoms, forming a mixture of said saturated gas with a source of semiconductor atoms, contacting a heated body with said mixture, thereby effecting the deposition of said semiconductor atoms and said impurity atoms upon said body. More specifically, the method of the present invention contemplates controlling the amount of active impurity atoms introduced into the crystal structure of a semiconductor body during the growth thereof by maintaining a solid doping agent at a predetermined temperature and flowing a stream of hydrogen thereover to saturate said hydrogen with an amount of doping agent determined by the vapor pressure thereof at the temperature involved. The impurity-saturated gas may thereafter be combined with a source of semiconductor atoms, such as for example, a thermally decomposable semiconductor compound, and the resulting mixture treated to obtain a deposit of semiconductor material having an accurately controlled uniformly distributed impurity content.

In practicing the method of the present invention there is first provided a solid source of a compound known to impart specific conductivity type characteristics to a given semiconductor material. For example, the elements phosphorus, arsenic, and antimony and compounds thereof may be used to impart n-type conductivity to semiconductors such as silicon and germanium, while the elements boron, aluminum, gallium and indium and their compounds impart p-type conductivity to these semiconductors. The selection of the particular solid doping compound for use in the invention is governed by (1) the nature of the semiconductor material to be produced, (2) the conductivity type desired to be imparted to the semiconductor body, and (3) the existence of favorable vapor pressure characteristics exhibited by the solid doping agent.

With respect to the last-named factor, solid doping agents which exhibit a wide range of vapor pressures over a convenient temperature range are suitable for use in the present invention. This characteristic provides a vapor source of impurity atoms over the solid doping agent, the concentration of which atoms is amendable to close and accurate control by means of temperature regulation of the doping agent.

The gaseous impurity atoms are rendered accessible for use by flowing a stream of carrier gas over the solid doping agent, thereby removing a quantity of vapor-state molecules per unit time, which quantity is dependent upon the equilibrium vapor pressure at the temperature involved and the flow rate of carrier gas over the solid source. There is thus obtained a stream of carrier gas containing an accurately controlled, predetermined amount of impurity atoms. This stream is then available for combination with a source of semiconductor atoms from which a solid deposit of semiconductor material is obtainable. The electrical characteristics of the resulting deposit will be determined by the cumulative effect of the concentration of impurity atoms in the carrier gas stream and the concentration of native impurity atoms present in the source of semiconductor atoms. Thus, a deposit of semiconductor material having a desired predetermined resistivity may be prepared in accordance with the present invention, by combining a controlled amount of impurity atoms from a solid doping agent with a source of semiconductor atoms containing a predetermined amount of native impurity atoms, and the resulting mixture treated to effect the codeposition of the semiconductor material and the impurity atoms.

Illustrative of solid doping agents which possess the characteristics herein above noted, and are therefore suitable for use in the present invention are $PCl_5$, $SbCl_3$, $AsCl_5$, $PBr_5$, $PH_4I$, $P_2I_4$, $P_3N_5$, $P_2O_5$, $As_2O_3$, $(PNCl_2)_{3-6}$, $AsI_3$, $SbI_3$, $Sb_2O_3$, and the like for producing n-type semiconductor materials and $B_{10}H_{14}$ and other higher hydrides of boron, such as $B_{10}H_{16}$ and the like, $BI_3$, $GaI_3$, $GaCl_3$, $GaF_3$, and the like, for producing p-type semiconductor materials, although $PCl_5$, $(PNCl_2)_3$ and $B_{10}H_{14}$ are preferred solid doping agents.

Referring now to the drawing, there is shown a schematic representation of an apparatus suitable for carrying out the method of the present invention. As is illustrated, the apparatus includes two major sub-assemblies; a reaction chamber designated at 20, and a piping system shown generally at 8, for introducing process gas into the reaction chamber. The piping system includes a carrier gas source 9 separately connected to flowmeters 16 and 17 through valves 14 and 15. Flowmeter 17 is connected to packed chamber 10 which contains the solid doping agent used in the process of the present invention. The packed chamber is enclosed by a constant temperature bath 11. Conduit 13 and valve 18 are provided to direct the efflux of gas from packed chamber 10 into conduit 25 which leads into reaction chamber 20. A section of the piping system comprising valve 14, flowmeter 16, and conduit 7 is provided to divert a portion of the carrier gas into vessel 12 containing a decomposable source of semiconductor atoms 6. Valve 4 and conduit 19 allow the introduction of carrier gas from vessel 12 into conduit 25. The arrangement comprising valves 3, 4 and 5 is provided to permit the system to be purged either independently of vessel 12 or together therewith as desired.

The reaction chamber 20 includes a quartz bell 18 secured to base 23 in air-tight fashion. Semiconductor rods 24 are supported within the chamber by supports 21 which extend through base 23 and lead to a source of electrical energy (not shown). Conducting bridge 27 provides electrical continuity between the semiconductor rods 24. Conduit 25 terminates within the reaction chamber as entry port 26 allowing for the introduction therein of process gas, and exit port 22 is provided for the efflux or reaction gases therefrom.

In accordance with the present invention, the preparation of n-type silicon using solid $PCl_5$ as the doping agent will now be described with reference to the apparatus in the drawing. Semiconductor rods 24 upon which subsequent deposition is to occur and which, in the present embodiment are silicon, are mounted on supports 21 and interconnected with a conducting bridge 27 of, for example, graphite. Thereafter, bell jar 18 is positioned on base 23 and secured thereto in gas-tight fashion. A thermally decomposable source of silicon atoms 6 such as, for example, silicochloroform is next provided within vessel 12 which is afterwards positioned in the piping system. In the embodiment described the silicochloroform used contains a native donor concentration sufficient to yield a deposited silicon layer of approximately 100 ohm-cm. if thermally decomposed independently of any external doping procedure. This is equivalent to $4.8 \times 10^{13}$ atoms P/cc. Si. Thereafter a quantity of solid doping agent, which in the preferred embodiment being described is $PCl_5$, is provided in chamber 10. The packed chamber is then positioned in the system and enclosed by constant temperature bath 11. The entire apparatus is then purged of oxygen by allowing the carrier gas from source 9 to flow throughout the system. Where silicon semiconductor material is being prepared from silicocholoroform as in the present embodiment, the preferred carrier gas is hydrogen. After the system has been purged, hydrogen from source 9 is allowed to flow through valve 15 and flowmeter 17 into packed chamber 10 wherein it intimately contacts the solid $PCl_5$ doping agent. The hydrogen should be essentially water-free to eliminate reaction with the $PCl_5$. As described previously, the rate of hydrogen flow over the $PCl_5$ and the temperature at which the $PCl_5$ is maintained by constant temperature bath 11 are essential features in controlling the amount of $PCl_5$ molecules introduced into the hydrogen stream. This variable is in turn critical in producing a desired resistivity in the subsequently deposited silicon. In the present embodiment, the hydrogen flows through packed chamber 10 at a rate of approximately 260 cc./min. S.T.P. and the solid $PCl_5$ is maintained at approximately −82° C. by constant temperature bath 11. Under thee conditions, approximately $7.2 \times 10\_^{9}$ moles/hr. $PCl_5$ are incorporated in the hydrogen stream and removed therewith as flow continues. The impurity saturated hydrogen is next directed through conduit 13 and valve 18 into conduit 25 where it mixes with a gaseous stream formed in a manner described hereinbelow.

As hydrogen flows at a controlled rate from source 9 through flowmeter 17 and into packed chamber 10, a second stream of hydrogen is allowed to flow at a predetermined controlled rate through valve 14, flowmeter 16 and conduit 7. The hydrogen stream enters vessel 12 through valve 5 and is allowed to bubble through the thermally decomposable source of semiconductor atoms 6, which in the present embodiment described in silicochloroform. The flow of hydrogen through the liquid silicochloroform causes the vaporization of a portion thereof, the vapor therefrom becoming admixed with the hydrogen stream. In the presently preferred embodiment, the rate of hydrogen flow through vessel 12 is controlled at about 5.5 l/min. S.T.P. This rate is sufficient to vaporize enough silicochloroform at room temperature to result in a subsequent silicon deposition rate hereinafter described of about 11 gms. per hour. The vapor mixture comprising hydrogen and silicochloroform is allowed to pass from vessel 12 through valve 4 and conduit 19 and into conduit 25 wherein it comes in contact with the $PCl_5$-laden hydrogen stream from packed chamber 10. The mixture thus formed passes through conduit 25 and enters reaction chamber 20 through entry port 26. Therein, the mixture comes in contact with silicon rods 24 which are heated to a temperature sufficient to cause the thermal decomposition of the $SiHCl_3$. A rod temperature of between 1150° and 1250° is suitable for this purpose and may be achieved, for example, by passing an electrical current from an electrical energy source connected to leads 28 through the rods. Upon contact with the heated silicon rods, the vaporized silicochloroform in the hydrogen stream decomposes along with the $PCl_5$ associated therewith resulting in the deposition of a silicon layer containing atoms of phosphorus uniformly distributed therethrough. Deposition is continued until a layer of predetermined thickness is obtained. Using the conditions hereinabove presented, a lawer of n-type silicon approximately 36 mils thick is deposited in about 3 hours.

The silicon layer so obtained is shown to have a resistivity of approximately 6.0 ohm-cm.

It will be readily apparent to those skilled in the art that essentially any resistivity may be imparted to semiconductor material, limited at its upper bound by the quantity of native impurity atoms present in the source of semiconductor atoms. These may be achieved by using proper combinations of various solid doping agent temperatures and carrier gas flow rates over the solid to incorporate into the subsequently deposited semiconductor body a desired quantity of impurity atoms. When provided with the physical characteristics of the solid doping agent as hereinafter presented, those skilled in the art may employ conventional mathematical computations to determine the proper conditions to produce semiconductor material having any desired resistivity.

Table I below shows the vapor pressure characteristics of $PCl_5$.

TABLE I

| PCl₅ temp., ° C.: | Vapor, pressure, atm. |
|---|---|
| +21 | $1.6\times10^{-4}$ |
| 0 | $5.26\times10^{-5}$ |
| −73 | $2.61\times10^{-8}$ |
| −108 (extrapolated) | $9.5\times10^{-11}$ |

Table II below shows the amount of gaseous impurity atoms incorporated into a hydrogen stream flowing at various rates over solid $PCl_5$ at the indicated temperature, and the resulting phosphorus concentration which may be expected in a body of subsequently deposited semiconductor material (assuming 100% deposition of phosphorus from the vapor stream), but exclusive of that contributed by the native impurity present in the source of semiconductor atoms used.

TABLE II

| Solid $PCl_5$ Temp., ° C. | Hydrogen flow rate over $PCl_5$, cc./min. (S.T.P.) | Moles $PCl_5$/hr. in $H_2$ stream | Carrier conc., atoms P/cc. Si |
|---|---|---|---|
| −108 | 1,000 | $21.1\times10^{-11}$ | $2.68\times10^{13}$ |
| −108 | 500 | $10.52\times10^{-11}$ | $1.34\times10^{13}$ |
| −108 | 200 | $4.21\times10^{-11}$ | $.534\times10^{13}$ |
| −108 | 50 | $1.052\times10^{-11}$ | $.134\times10^{13}$ |
| −95 | 1,000 | $23.6\times10^{-10}$ | $30.0\times10^{13}$ |
| −95 | 500 | $11.8\times10^{-10}$ | $15.0\times10^{13}$ |
| −95 | 200 | $4.72\times10^{-10}$ | $6.0\times10^{13}$ |
| −95 | 50 | $1.18\times10^{-10}$ | $1.5\times10^{13}$ |
| −82 | 1,000 | $19.8\times10^{-9}$ | $25.1\times10^{14}$ |
| −82 | 500 | $9.9\times10^{-9}$ | $12.5\times10^{14}$ |
| −82 | 200 | $3.95\times10^{-9}$ | $5.0\times10^{14}$ |
| −82 | 50 | $.99\times10^{-9}$ | $1.25\times10^{14}$ |
| −71 | 1,000 | $10.42\times10^{-8}$ | $13.25\times10^{15}$ |
| −71 | 500 | $5.22\times10^{-8}$ | $6.62\times10^{15}$ |
| −71 | 200 | $2.08\times10^{-8}$ | $2.64\times10^{15}$ |
| −71 | 50 | $.522\times10^{-8}$ | $.662\times10^{15}$ |
| −48.0 | 1,000 | $16.80\times10^{-7}$ | $21.3\times10^{16}$ |
| −48.0 | 500 | $8.40\times10^{-7}$ | $10.65\times10^{16}$ |
| −48.0 | 200 | $3.36\times10^{-7}$ | $4.26\times10^{18}$ |
| −48.0 | 50 | $.840\times10^{-7}$ | $1.06\times10^{16}$ |
| −10.0 | 1,000 | $5.88\times10^{-5}$ | $7.47\times10^{18}$ |
| −10.0 | 500 | $2.94\times10^{-5}$ | $3.73\times10^{18}$ |
| −10.0 | 200 | $1.17\times10^{-5}$ | $1.48\times10^{18}$ |
| −10.0 | 50 | $.294\times10^{-5}$ | $.373\times10^{18}$ |

Table III below shows the interrelationship between various hydrogen flow rates over solid $PCl_5$ at the indicated temperatures, the native impurity concentration of the silicochloroform, and the resistivity of the silicon produced therefrom.

TABLE III

| Native Impurity conc. of $SiHCl_3$, atoms P/cc. Si* | $PCl_5$ temp., ° C. | $H^2$ flow rate over $PCl_5$ at S.T.P., cc./min. | Resistivity of Silicon produced |
|---|---|---|---|
| $4.8\times10^{13}$ (100 ohm-cm.) | −78 | 300 | 0.026 |
| $4.8\times10^{13}$ (100 ohm-cm.) | −79 | 50 | 0.15 |
| $4.8\times10^{13}$ (100 ohm-cm.) | −80 | 1,000 | 0.6 |
| $4.8\times10^{13}$ (100 ohm-cm.) | −80 | 250 | 6.0 |
| $4.8\times10^{13}$ (100 ohm-cm.) | −10 | 100 | 0.04 |
| $9.2\times10^{13}$ (50 ohm-cm.) | −78 | 175 | 2.8 |
| $9.2\times10^{13}$ (50 ohm-cm.) | −79 | 150 | 4.0 |
| $9.2\times10^{13}$ (50 ohm-cm.) | −90 | 270 | 13.5 |
| $9.2\times10^{13}$ (50 ohm-cm.) | −94 | 500 | 18.1 |
| $9.2\times10^{13}$ (50 ohm-cm.) | −107 | 1,000 | 23.0 |
| $2.0\times10^{14}$ (24 ohm-cm.) | −93 | 700 | 2.0 |
| $2.0\times10^{14}$ (24 ohm-cm.) | −91 | 550 | 4.1 |

*Impurity concentration is expressed in terms of atoms of phosphorus per cc. of silicon produced from the $SiHCl^3$ without the introduction of impurities from an external source. The number in parentheses indicates the resistivity of the silicon corresponding to the impurity concentration.

As is apparent from the tables above, doping with solid phosphorus pentachloride is most conveniently effected by heating the phosphorus pentachloride within a temperature range of from about room temperature to about −120° C. Within this temperature range there is provided n-type semiconductor material having a resistivity of 0.01 ohm-cm. and greater.

The following data illustrate in detail similar results obtained for p-type doping using decarborane ($B_{10}H_{14}$) as a solid doping agent. Table IV below shows the vapor pressure characteristics of $B_{10}H_{14}$.

TABLE IV

| $B_{10}H_{14}$ temp., ° C.: | Vapor pressure, atm. |
|---|---|
| +25 | $2.5\times10^{-4}$ |
| +10 | $7.6\times10^{-5}$ |
| 0 | $3.5\times10^{-5}$ |
| −20 | $5.5\times10^{-6}$ |
| −70 | $1.2\times10^{-8}$ |

Table V below shows the amount of gaseous impurity atoms incorporated into a hydrogen stream flowing at various rates over solid $B_{10}H_{14}$ at the indicated temperatures and the resulting boron concentration which may be expected in a body of subsequently deposited semiconductor material (assuming 100% deposition of boron from the vapor stream) but exclusive of that contributed by the native impurity present in the source of semiconductor atoms used.

TABLE V

| Solid $B_{10}H_{14}$ (° C.) | Hydrogen Flow Rate over $B_{10}H_{14}$ (cc./min. S.T.P.) | Resistivity of silicon, ohm-cm. |
|---|---|---|
| −60 | 1,000 | 61 |
| | 600 | 120 |
| | 200 | 850 |
| −50 | 1,000 | 15 |
| | 600 | 23 |
| | 200 | 82 |
| −40 | 1,000 | 4.3 |
| | 600 | 6.4 |
| | 200 | 20 |
| −30 | 1,000 | 1.5 |
| | 600 | 2.2 |
| | 200 | 6.6 |
| −12 | 1,000 | 0.27 |
| | 600 | 0.39 |
| | 200 | 1.1 |
| 0 | 1,000 | 0.1 |
| | 600 | 0.13 |
| | 200 | 0.34 |

As will be apparent from the tables above, the predetermined resistivities within the range of 0.01 ohm-cm. and greater p-type may be obtained using solid decaborane as the doping agent. The more useful resistivity range is 0.1 ohm-cm. to 150 ohm-cm. obtained at temperatures between about 0° C. to −60° C.

The invention may also be utilized for the production of doped semiconductor germanium bodies. For example, p-type germanium material having a resistivity in the range 0.05–5 ohm/cm. may be prepared using decaborane as the solid doping agent. Typical experimental data are presented below in Table VI for a series of experiments using a deposit rate of 0.336 cc. of germanium per hour.

TABLE VI

| Temp. $B_{10}H_{14}$, ° C. | Doping Gas $H_2$ Flow Rate cc./min. at S.T.P. | Resistivity Obtained, ohm-cm. |
|---|---|---|
| 0 | 1,000 | 0.06 |
| | 500 | 0.09 |
| | 250 | 0.13 |
| −10 | 1,000 | 0.095 |
| | 500 | 0.15 |
| | 250 | 0.26 |
| −20 | 1,000 | 0.18 |
| | 500 | 0.34 |
| | 250 | 0.65 |
| −30 | 1,000 | 0.42 |
| | 500 | 0.8 |
| | 250 | 1.6 |
| −40 | 1,000 | 1.3 |
| | 500 | 2.4 |
| | 250 | 4.6 |

The following data illustrate in detail similar results obtained for n-type doping using trimer phosphorus nitrile chloride $(PNCl_2)_3$ as a solid doping agent. Table VII below shows the vapor pressure characteristics of $(PNCl_2)_3$

TABLE VII

| $(PNCl_2)_3$ temp., ° C.: | Vapor pressure, atm. |
|---|---|
| 0 | $6.8\times10^{-7}$ |
| −20 | $5.5\times10^{-8}$ |
| −35 | $5.8\times10^{-9}$ |

Table VIII below shows interrelationship between the amount of gaseous impurity atoms incorporated into a hydrogen stream flowing at various rates over solid $(PNCl_2)_3$ at indicated temperatures as evidenced by the resulting phosphorus concentration which may be expected in a body of subsequently deposited semiconductor material in terms of ohm-cm. as compared to the native impurity present in the source of semiconductor atoms used.

TABLE VIII

| Run No. | Solid $(PNCl_2)_3$ (° C.) | Hydrogen Flow Rate over $(PNCl_2)_3$ (cc./min. S.T.P.) | Native Impurity, ohm-cm. | Resistivity of silicon, ohm-cm. |
|---|---|---|---|---|
| 335 | −35 | 270 | 18.2 | 4.8 |
| 355 | −20 | 270 | 14.0 | 3.2 |
| 357 | ---------- | 1,100 | 14.0 | 1.2 |
| 361 | 0 | 63 | 16.3 | 1.05 |
| 347 | ---------- | 270 | 23.5 | 0.26 |
| 351 | ---------- | 1,100 | 23.5 | 0.17 |

Although the foregoing detailed description has been given with reference to the introduction of impurities from a solid source into silicon and germanium, it should be understood that the method of the present invention is applicable to the preparation of other semiconductor materials, as for example, the group III–V intermetallic compounds, such as gallium arsenide, indium antimonide, indium phosphide and the like.

While the invention has ben described with particular reference to cetrain embodiments thereof, it will be understood that various changes and modifications may be made which are within the skill of the art.

We claim:

1. In the method of introducing conductivity type imparting impurity atoms as a dopant into the crystal lattice of a semiconductor material, wherein a first stream of a carrier gas containing a thermally decomposable source of semiconductor atoms is mixed with a second stream of the carrier gas containing a source of the dopant and the combined streams are introduced into a chamber where the mixture is heated to a temperature sufficient to effect thermal decomposition of said source of semiconductor atoms and the codeposition of said semiconductor atoms and said dopant onto a suitable surface in said chamber, the improvement in said method: providing a dopant compound which contains atoms of the desired conductivity type imparting impurity and is solid at a temperature within the temperature range of 25° C. to −120° C., said dopant compound being decaborane, maintaining said dopant compound at a temperature within said temperature range, and passing carrier gas over said compound to produce said second stream of carrier gas containing a source of dopant.

2. In the method of introducing conductivity type imparting impurity atoms as a dopant into the crystal lattice of a semiconductor material, wherein a first stream of a carrier gas containing a thermally decomposable source of semiconductor atoms is mixed with a second stream of the carrier gas containing a source of the dopant and the combined streams are introduced into a chamber where the mixture is heated to a temperature sufficient to effect thermal decomposition of said source of semiconductor atoms and the codeposition of said semiconductor atoms and said dopant onto a suitable surface in said chamber, the improvement in said method: providing a dopant compound which contains atoms of the desired conductivity type imparting impurity and is solid at a temperature within the temperature range of 25° C. to −120° C., said dopant compound being $(PNCl_2)_3$, maintaining said dopant compound at a temperature within said temperature range, and passing carrier gas over said compound to produce said second stream of carrier gas containing a source of dopant.

References Cited by the Examiner

UNITED STATES PATENTS

| | | | |
|---|---|---|---|
| 2,910,394 | 10/1959 | Scott et al. | 252—62.3 |
| 3,007,816 | 11/1961 | McNamara | 252—62.3 |
| 3,082,126 | 3/1963 | Hung Chi Chang | 252—62.3 |

TOBIAS E. LEVOW, *Primary Examiner.*

R. D. EDMONDS, *Assistant Examiner.*